(12) United States Patent
Won et al.

(10) Patent No.: US 8,624,255 B2
(45) Date of Patent: Jan. 7, 2014

(54) ARRAY SUBSTRATE AND METHOD OF FABRICATING THE SAME

(75) Inventors: Yu-Bong Won, Yongin-si (KR); Jin-Goo Jung, Yongin-si (KR); Seung-Gyu Tae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 108 days.

(21) Appl. No.: 13/027,073

(22) Filed: Feb. 14, 2011

(65) Prior Publication Data

US 2011/0266545 A1 Nov. 3, 2011

(30) Foreign Application Priority Data

Apr. 30, 2010 (KR) .................. 10-2010-0041005

(51) Int. Cl.
*H01L 29/12* (2006.01)
(52) U.S. Cl.
USPC .............. 257/71; 257/68; 257/69; 257/70; 257/296; 257/516; 257/E27.016
(58) Field of Classification Search
USPC ............. 257/59, 68–71, 296, 516, E27.016
See application file for complete search history.

(56) References Cited

U.S. PATENT DOCUMENTS

| | | | |
|---|---|---|---|
| 5,923,390 A | 7/1999 | Jung Mok et al. | |
| 2006/0181218 A1* | 8/2006 | Jung et al. | 313/631 |
| 2008/0158209 A1* | 7/2008 | Ozawa | 345/204 |
| 2009/0085037 A1* | 4/2009 | Chen et al. | 257/71 |

FOREIGN PATENT DOCUMENTS

| | | |
|---|---|---|
| KR | 10-1999-0003712 | 1/1999 |
| KR | 10-2003-0016536 A | 3/2003 |
| KR | 10-2003-0055502 A | 4/2003 |
| KR | 10-0754128 | 8/2007 |

* cited by examiner

*Primary Examiner* — Minchul Yang
(74) *Attorney, Agent, or Firm* — Christie, Parker & Hale, LLP

(57) ABSTRACT

An array substrate includes an active layer including a channel region, a gate electrode positioned corresponding to the channel region, and a gate insulating film between the active layer and the gate electrode. The gate electrode includes a transparent conductive film and an opaque conductive film, and the transparent conductive film is between the channel region and the opaque conductive film.

17 Claims, 6 Drawing Sheets

ARRAY SUBSTRATE AND METHOD OF FABRICATING THE SAME

CROSS-REFERENCE TO RELATED APPLICATIONS

This application claims priority to and the benefit of Korean Patent Application No. 10-2010-0041005 filed in the Korean Intellectual Property Office on Apr. 30, 2010, the entire contents of which are incorporated herein by reference.

BACKGROUND OF THE INVENTION

1. Field

The described technology relates generally to an array substrate, and more particularly, to a thin film transistor array substrate of a liquid crystal display or an organic light emitting diode display, and a method of fabricating the same.

2. Description of the Related Art

Liquid crystal displays (LCDs) and organic light emitting diode (OLED) displays are widely used for small-sized electronics and other products, such as cell phones, personal digital assistants (PDAs), and portable multimedia players (PMPs), in part because they themselves are relatively small-sized and lightweight.

As display devices become smaller in size, the demand for higher resolutions increases. In order to realize higher resolution, it is desirable to make the size of each pixel smaller. As the size of pixels becomes smaller, it is necessary to increase the aperture ratio of the pixels, in order to satisfy brightness higher than a predetermined level.

A display device, such as a liquid crystal display or an organic light emitting diode display, includes an array substrate, where a thin film transistor (TFT) for applying a driving voltage to a pixel electrode and a storage capacitor for storing a voltage signal in each pixel are formed on the array substrate in order to display an image. In general, a gate electrode of a thin film transistor, an electrode of a storage capacitor, etc., are formed of an opaque metal. In this case, reduction in aperture ratio may occur. Moreover, reduced picture quality caused by crosstalk between adjacent thin film transistors due to leakage current formed in the display device may occur.

The above information disclosed in the Background section is only for enhancement of understanding of the background of the described technology, and therefore, may contain information that does not form the prior art that is already known in this country to a person of ordinary skill in the art.

SUMMARY OF THE INVENTION

The described technology has been made to provide an array substrate of a display device that enhances picture quality by improving the aperture ratio and reducing leakage current.

Furthermore, embodiments of the present invention provide a method of fabricating an array substrate that improves the aperture ratio without an additional mask process.

According to one exemplary embodiment, an array substrate includes an active layer including a channel region, a gate electrode positioned corresponding to the channel region, and a gate insulating film between the active layer and the gate electrode. The gate electrode includes a transparent conductive film and an opaque conductive film, and the transparent conductive film is between the channel region and the opaque conductive film.

The transparent conductive film and the opaque conductive film may be in direct contact with each other.

The transparent conductive film may include indium tin oxide (ITO), and the opaque conductive film may include molybdenum.

The transparent conductive film and the opaque conductive film may have substantially a same width.

The active layer may include polysilicon, the active layer may further include a source region on one side of the channel region and a drain region on an opposite side of the channel region, wherein the channel region may include N-type impurities, and the source region and the drain region may include P-type impurities.

According to one exemplary embodiment, the array substrate may further include a capacitor including: a transparent lower electrode; a first insulating film on the transparent lower electrode and utilized as a dielectric film; an upper electrode positioned on the first insulating film corresponding to the transparent lower electrode; and an opaque lower electrode between the first insulating film and the transparent lower electrode.

The transparent lower electrode and the opaque lower electrode may include the same materials as the transparent conductive film and the opaque conductive film, respectively.

The transparent lower electrode and the opaque lower electrode may be arranged on the same layer as the transparent conductive film and the opaque conductive film, respectively.

The upper electrode may include a transparent conductive material.

A width of the transparent lower electrode may be greater than a width of the upper electrode.

According to one exemplary embodiment, the array substrate may further include a second insulating layer on the first insulating film, wherein the first insulating film may be on the gate electrode, the active layer, and the gate insulating film, and the upper electrode may be between the first insulating film and the second insulating layer.

According to one exemplary embodiment, the array substrate may further include a source electrode connected to the source region through a first hole in the first insulating film and the second insulating layer, and a drain electrode connected to the drain region through a second hole in the first insulating film and the second insulating layer, and connected to the upper electrode through a third hole in the second insulating layer.

The third hole may be positioned corresponding to the opaque lower electrode, with the first insulating film and the upper electrode interposed therebetween.

According to one exemplary embodiment, the array substrate may further include an organic film on the second insulating layer, the source electrode, and the drain electrode.

According to the exemplary embodiment, the array substrate may further include a protective film separating the second insulating layer and source and drain electrodes from the organic film.

According to the exemplary embodiment, the array substrate may further include a pixel electrode connected to the drain electrode through a fourth hole in the organic film.

The fourth hole may be positioned corresponding to the opaque lower electrode, with the first insulating film, the upper electrode, and the drain electrode interposed therebetween.

According to another the exemplary embodiment, a method of fabricating an array substrate includes: sequentially forming an active layer, an insulating layer, a transparent conductive layer, an opaque conductive layer, and a photoresist layer on a substrate; and forming a first photoresist film positioned corresponding to the active layer and having a smaller width than that of the active layer and a second photoresist film spaced apart from the first photoresist film from the photoresist layer. The method further includes: forming a first opaque conductive film and a second opaque conductive film under the first photoresist film and the second photoresist film, respectively, by etching the opaque conductive layer utilizing a first etching process; forming a first transparent conductive film and a second transparent conductive film under the first opaque conductive film and the second opaque conductive film, respectively, by etching the transparent conductive layer utilizing a second etching process; reducing the width of the second photoresist film utilizing an ashing process, reducing widths of the first opaque conductive film and the second opaque conductive film to be smaller than the widths of the first photoresist film and the second photoresist film, respectively, utilizing a third etching process; and removing the first photoresist film and the second photoresist film.

The method may further include doping side portions of the active layer with a P+ impurity after the second etching process, and doping the active layer with a P− impurity after the removal of the first photoresist film and the second photoresist film.

The first opaque conductive film and the first transparent conductive film may form a gate electrode, and the second opaque conductive film and the second transparent conductive film may form a lower electrode of a capacitor.

The first opaque conductive film and the first transparent conductive film may have a substantially same width, and a width of the second transparent conductive film may be greater than the width of the second opaque conductive film.

The first etching process may be a dry etching process or wet etching process.

The second etching process and the third etching process may be wet etching processes.

The opaque conductive layer may have a lower electrical resistance than the transparent conductive layer.

The opaque conductive layer may include molybdenum, and the transparent conductive layer may include ITO.

According to one exemplary embodiment, a display device having high resolution can be realized by increasing the aperture ratio of a pixel.

Moreover, the picture quality of the display device can be enhanced by preventing crosstalk by a reduction in leakage current.

Furthermore, in the fabrication of an array substrate of the display device having high resolution, the process can be simplified because there is no additional mask process.

Figure 1:
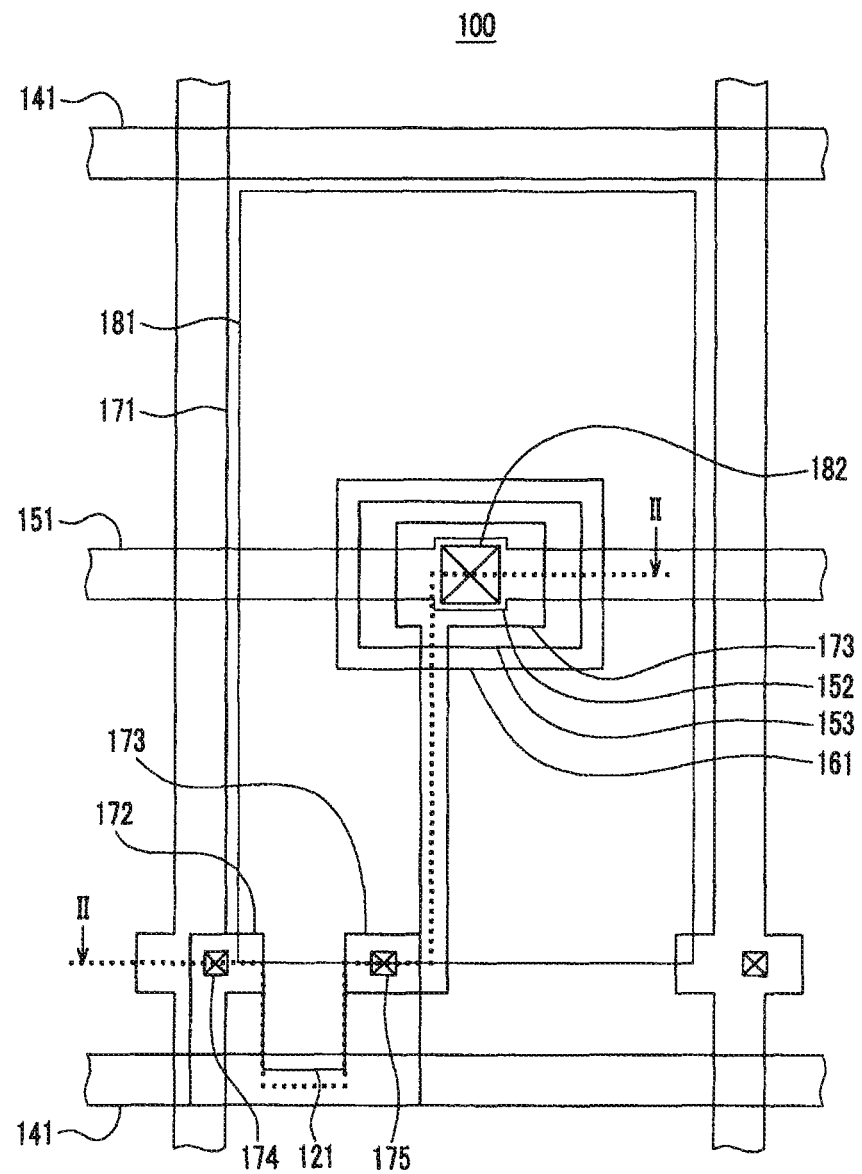
FIG. 1 is a planar layout view of an array substrate according to a first exemplary embodiment.

DESCRIPTION OF SYMBOLS 100, 101, 102: array substrate
110, 210: insulation substrate
121, 121' 221: active layer
122, 222: source region
123, 223: drain region
124, 224: channel region
125, 126, 225, 226: lightly doped drain region
131, 230: gate insulating film
133: first interlayer insulating layer
135: second interlayer insulating layer
137: protective film
139, 139' organic film
141, 141' gate line
142, 251: opaque conductive film
143, 241: transparent conductive film
151: sustain voltage line
152, 252: opaque lower electrode
153, 153' 242: transparent lower electrode
161, 161' upper electrode
162: third contact hole
171: data line
172, 172' source electrode
173, 173' drain electrode
174, 174' first contact hole
175, 175' second contact hole
181: pixel electrode
182: via hole
220: polysilicon layer
240: transparent conductive film
250: opaque conductive film
261, 262: photoresist film

DETAILED DESCRIPTION

The present invention will be described more fully hereinafter with reference to the accompanying drawings, in which exemplary embodiments of the invention are shown.

As those skilled in the art will recognize, the described embodiments may be modified in various different ways without departing from the spirit or scope of the present invention. In addition, the size and thickness of each component in the drawings are arbitrarily shown for better understanding and ease of description, and thus the present invention is not limited to those shown in the drawings. In the drawings, the thickness of layers, films, panels, regions, etc., are exaggerated for clarity. It will be understood that when an element such as a layer, film, region, or substrate is referred to as being "on" another element, it can be directly on the other element, or one or more intervening elements may also be present.

Figure 2:
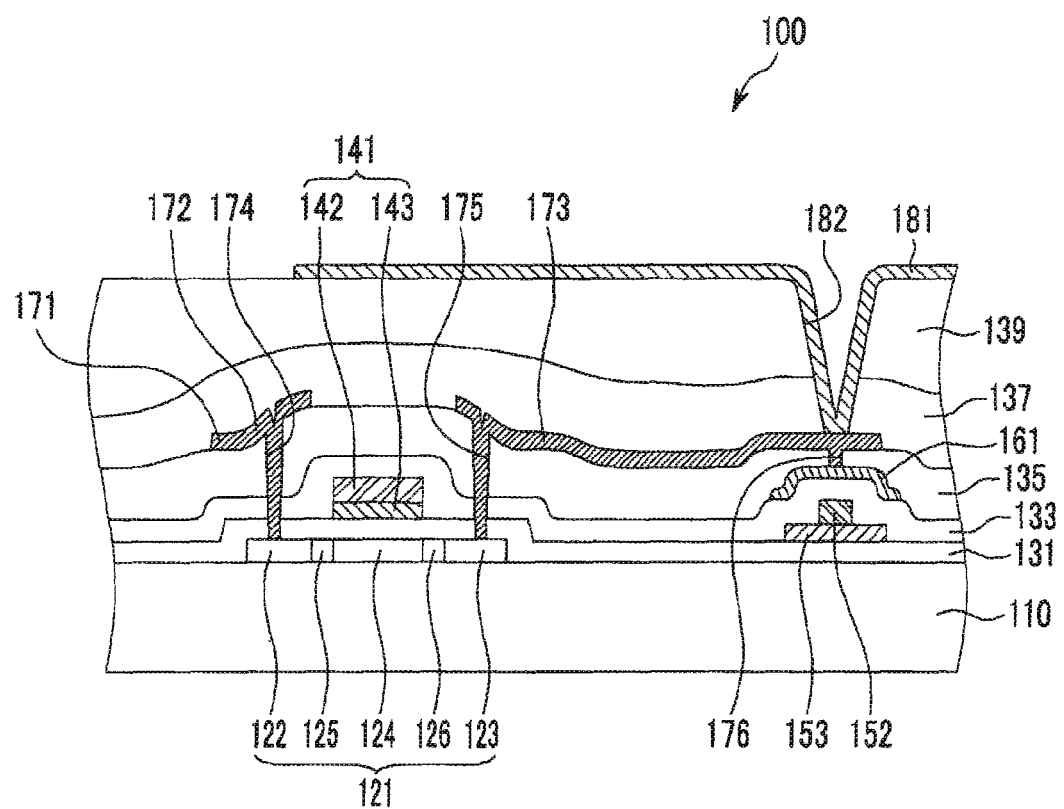
FIG. 2 is a cross-sectional view of the array substrate taken along line II-II of FIG. 1.

FIG. 1 is a planar layout view of an array substrate according to a first exemplary embodiment, and FIG. 2 is a cross-sectional view of the array substrate taken along line II-II of FIG. 1.

Referring to FIGS. 1 and 2, the array substrate 100 according to this exemplary embodiment includes a thin film transistor including an active layer 121, a gate electrode, a source electrode 172, and a drain electrode 173, a storage capacitor including an upper electrode 161 and a lower electrode (152 and 153), and a pixel electrode 181.

First, a region where the thin film transistor is formed will be described with reference to the left bottom of FIG. 1 and the left side of FIG. 2. The active layer 121 may be formed of polysilicon on an insulation substrate 110, and may include a source region 122, a drain region 123, and a lightly doped drain (LDD) region (125 and 126) that are provided around a channel region 124 formed at a center thereof.

A gate insulating film 131 for insulating the active layer 121, and a gate line 141, are formed on the active layer 121, where the gate line 141 is formed on the gate insulating film 131. A portion of the gate line 141 corresponding to the channel region 124 of the active layer 121 acts as a gate electrode of the thin film transistor, and gate signals are transmitted through the gate line 141.

In this exemplary embodiment, the gate line 141 may be formed in a double-layered structure including an opaque conductive film 142 and a transparent conductive film 143. In this exemplary embodiment, the opaque conductive film 142 and the transparent conductive film 143 have approximately the same side etching surface because the widths thereof are approximately the same, and the opaque conductive film 142 and the transparent conductive film 143 may respectively include molybdenum and indium tin oxide (hereinafter referred to as "ITO"). However, the present invention is not limited thereto, and the opaque conductive film 142 and the transparent conductive film 143 may respectively include various low-resistance conductive materials and transparent conductive materials.

A transparent conductive material such as ITO for forming the transparent conductive film 143 has relatively high electrical resistance. Thus, in the case that the gate line 141 is formed only of the transparent conductive film 143 to obtain an aperture ratio, a problem of signal delay may occur. In this exemplary embodiment, however, the problem of signal delay can be alleviated or avoided since the opaque conductive film 142 including molybdenum having low electrical resistance and the transparent conductive film 143 together form the gate line 141.

On the other hand, in the case that the gate line 141 is formed only of the opaque conductive film 142 including molybdenum, a high off-leakage current of about $10^{-7}$ A to $10^{-8}$ A is generated. In the case of a high leakage current, crosstalk is generated between adjacent thin film transistors, and as a result, the picture quality may be lowered. However, in this exemplary embodiment, the opaque conductive film 142 including molybdenum and the transparent conductive film 143 including ITO together form the gate line 141, and this leads to a negative shift in threshold voltage, thereby reducing leakage current to about $10^{-12}$ A. Specifically, the transparent conductive film 143, along with the gate insulating film 131, serves as a dielectric film because the transparent conductive film 143 including ITO is formed adjacent to the gate insulating film 131. Since the ITO has relatively high electrical resistance, a voltage drop occurs in the ITO, thereby shifting the threshold voltage in a negative direction, which can result in the reduction of the leakage current to about $10^{-12}$ A, and therefore can suppress crosstalk and improve picture quality.

A first interlayer insulating layer 133 and a second interlayer insulating layer 135 are formed on the gate line 141, and a data line 171 for transmitting data signals is formed on the second interlayer insulating layer 135. Although in this embodiment the data line 171 is formed in a laminated structure of titanium-aluminum-titanium, this is only an illustration and the data line may be formed of various different metals. The data line 171 is connected to a source electrode 172 at a position corresponding to one side of the active layer 121, and a drain electrode 173 is formed at a position corresponding to the other side of the active layer 121, spaced apart from the source electrode 172. A first contact hole 174 and a second contact hole 175 respectively provide access to the source region 122 and the drain region 123 of the active layer 121, and are formed in the gate insulating film 131, the first interlayer insulating layer 133, and the second interlayer insulating layer 135, and the source electrode 172 and the drain electrode 173 formed on the second interlayer insulating layer 135 are connected to the source region 122 and the drain region 123, respectively, through these contact holes.

A driving voltage is applied to the pixel electrode 181 to be described later by the above configuration of the thin film transistor including the active layer 121, the gate line 141, the source electrode 172, and the drain electrode 173. The configuration of the thin film transistor in this exemplary embodiment has been disclosed for illustrative purposes, and it will be apparent to those skilled in the art that various modifications can be made to the structure of the thin film transistor.

Subsequently, referring to the central portion of FIG. 1 and the right side portion of FIG. 2, a region where the storage capacitor is formed will now be described. A sustain voltage line 151 is formed on the same layer as the gate line 141 on the gate insulating film 131. The sustain voltage line 151 forms the opaque lower electrode 152 at the center of a pixel. In this exemplary embodiment, the transparent lower electrode 153 is further formed between the gate insulating film 131 and the sustain voltage line 151, and forms the lower electrode of the storage capacitor together with the opaque lower electrode 152. In this exemplary embodiment, the sustain voltage line 151 and the opaque lower electrode 152 may be formed of the same material as the opaque conductive film 142, and the transparent lower electrode 153 may be formed of the same material as the transparent conductive film 143. That is, the sustain voltage line 151 and the opaque lower electrode 152 may include molybdenum, and the transparent lower electrode 153 may include ITO. However, it is understood that the materials described herein are only illustrative, and various other materials can be utilized as will be recognized by a person of ordinary skill in the art.

In this exemplary embodiment, the transparent lower electrode 153 is formed wider than the opaque lower electrode 152. A voltage is applied to the opaque lower electrode 152 through the sustain voltage line 151. The opaque lower electrode 152 can prevent or reduce signal delay because it is formed of a low resistance material, but the aperture ratio can also be reduced due to the sustain voltage line 151 and the opaque lower electrode 152. Therefore, if the opaque lower electrode 152 is made small and the transparent lower electrode 153 is made relatively larger, the storage capacitor can ensure sufficient capacitance and the aperture ratio can be improved.

An upper electrode 161 is formed on the opaque lower electrode 152 and the transparent lower electrode 153, with a first interlayer insulating layer 133 interposed therebetween. The upper electrode 161 constitutes the storage capacitor together with the lower electrode including the opaque lower electrode 152 and the transparent lower electrode 153. At this time, the first interlayer insulating layer 133 serves as a dielectric film. In this exemplary embodiment, the upper electrode 161 may be formed of ITO, which is a transparent conductive material, in order to improve the aperture ratio by the upper electrode 161. The upper electrode 161 is covered with the second interlayer insulating layer 135, and is connected to the drain electrode 173 through a third contact hole 176 formed in the second interlayer insulating layer 135.

A voltage signal to be applied to the pixel electrode 181 to be described later can be sustained by the configuration of the storage capacitor including the opaque lower electrode 152, the transparent lower electrode 153, the upper electrode 161, and the first interlayer insulating layer 133 serving as the dielectric film.

A protective film 137 is formed on the thin film transistor and storage capacitor described hereinabove, and an organic film 139 is further formed on the protective film 137. A via hole 182 providing access to the drain electrode 173 is formed in the protective film 137 and the organic film 139, and the pixel electrode 181 formed on the organic film 139 is connected to the drain electrode 173 through the via hole 182. With this configuration, the pixel electrode 181 can receive a driving voltage, and an electric field is applied between the pixel electrode 181 and a common electrode facing the pixel electrode 181, whereby, for example, liquid crystal or an organic emission layer interposed between the pixel electrode 181 and the common electrode can be driven to display an image.

Meanwhile, in this exemplary embodiment, the via hole 182 and the third contact hole 176 are formed at a position corresponding to (e.g., substantially aligned with) the opaque lower electrode 152. With this configuration, a reduction in aperture ratio by the via hole 182 and the third contact hole 176 can be effectively suppressed. However, the present invention is not limited to this configuration, but the positions of the via hole 182 and the third contact hole 176 can be variously changed according to process conditions, etc.

As such, the array substrate 100 according to this exemplary embodiment can improve the aperture ratio and suppress or reduce picture quality degradation or inaccuracies caused by signal delay and the generation of leakage current, by utilizing the gate line 141 having a double layer including the opaque conductive film 142 and the transparent conductive film 143 and utilizing a lower electrode of the storage capacitor having a double layer including the opaque lower electrode 152 and the transparent lower electrode 153.

Other exemplary embodiments will be described below. In the following description, components that are same or similar as, or equivalent to those in the first exemplary embodiment are described only briefly, or a description thereof may be omitted.

Figure 3:
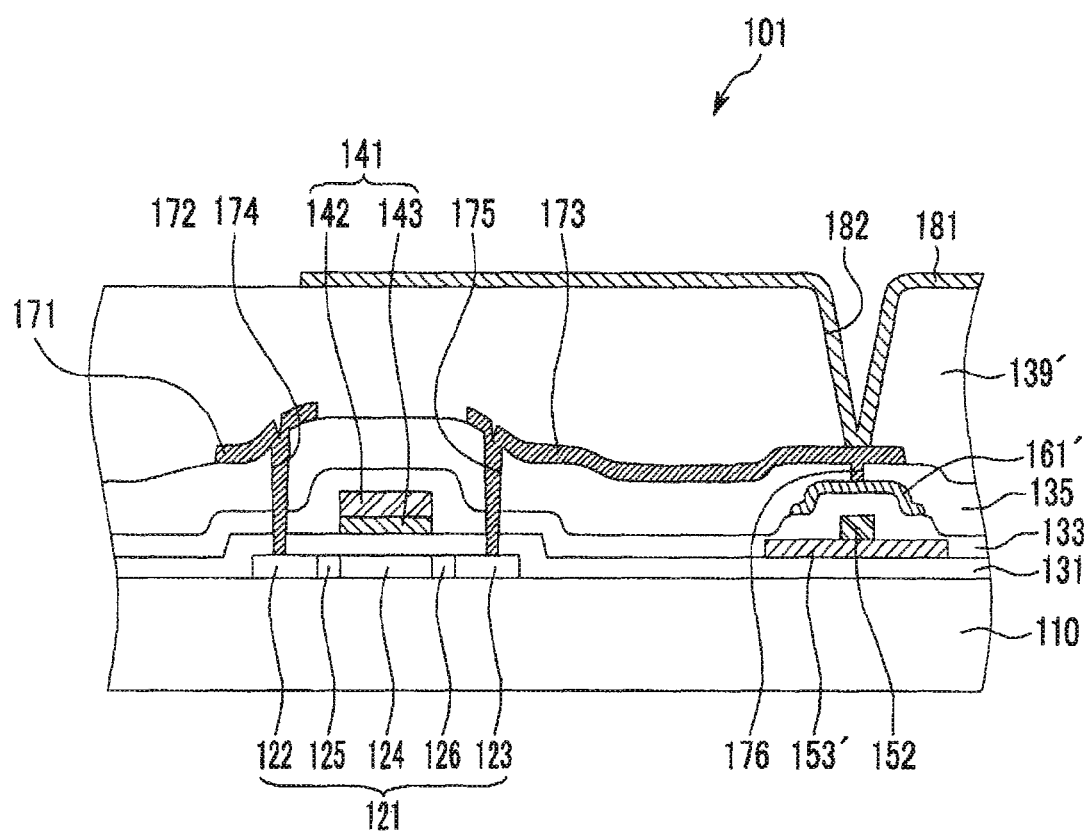
FIG. 3 is a cross-sectional view of an array substrate according to a second exemplary embodiment.

FIG. 3 is a cross-sectional view of an array substrate according to a second exemplary embodiment. Referring to FIG. 3, the array substrate 101 according to this exemplary embodiment includes a thin film transistor, a storage capacitor, and a pixel electrode 181, and the thin film transistor and the pixel electrode 181 are configured in the same or similar manner as in the first exemplary embodiment.

The storage capacitor in this exemplary embodiment includes a lower electrode including an opaque lower electrode 152 and a transparent lower electrode 153', an upper electrode 161', and a first interlayer insulating layer 133 interposed therebetween and serving as a dielectric film. In this exemplary embodiment, the size of the transparent lower electrode 153' may be relatively greater than the size of the upper electrode 161'. That is, the size of the transparent lower electrode 153' may be greater compared to the size of the transparent electrode 153 in first exemplary embodiment. With this configuration, a storage capacitance with the upper electrode 161' can be further increased. Accordingly, the aperture ratio can be improved, and the performance of the storage capacitor can be improved.

Moreover, in this exemplary embodiment, only an organic film 139' is formed on the thin film transistor and the storage capacitor, and no separate protective film is formed. Since the formation of a protective film may cause a reduction in aperture ratio, this exemplary embodiment can contribute to improvement of the aperture ratio by omitting the protective film.

Figure 4:
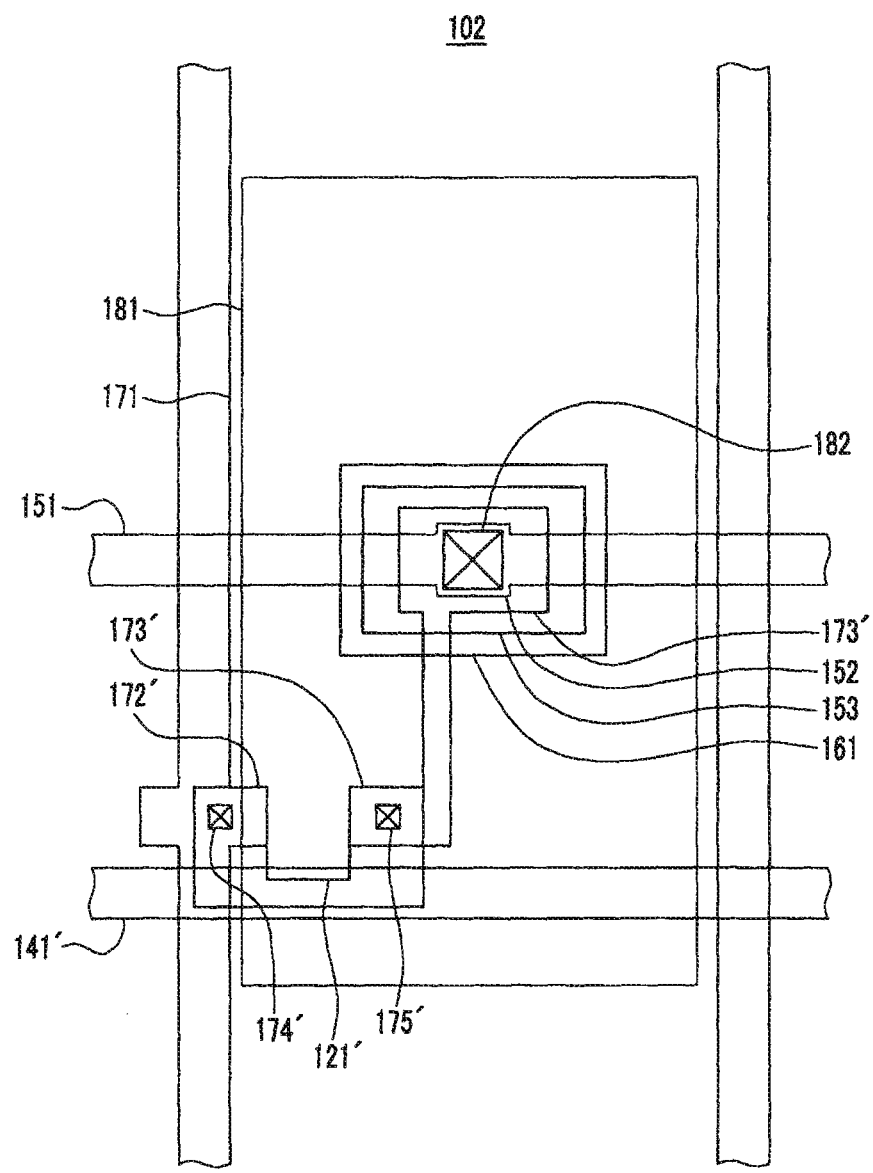
FIG. 4 is a planar layout view of an array substrate according to a third exemplary embodiment.

FIG. 4 is a planar layout view of an array substrate according to a third exemplary embodiment. Referring to FIG. 4, the array substrate 102 according to this exemplary embodiment includes a thin film transistor, a storage capacitor, and a pixel electrode 181, and the storage capacitor and the pixel electrode 181 are configured in the same or similar manner as in the first exemplary embodiment.

In this exemplary embodiment, the thin film transistor includes an active layer 121', a gate line 141', a source electrode 172' connected to a data line 171, and a drain electrode 173' spaced apart therefrom. Moreover, a gate insulating film is formed between the active layer 121' and the gate line 141', a first interlayer insulating layer and a second interlayer insulating layer are formed between the gate line 141' and the source electrode 172' and drain electrode 173', and a first contact hole 174' and a second contact hole 175' are formed on the gate insulating film, the first interlayer insulating layer, and the second interlayer insulating layer. The source electrode 172' and the drain electrode 173' are respectively connected to the source region and drain region of the active layer 121' through the first and second contact holes 174' and 175'.

The drain electrode 173' of this exemplary embodiment is formed shorter compared to the drain electrode 173 of the first exemplary embodiment. Accordingly, as shown in FIG. 4, the thin film transistor has such a configuration in which it is shifted towards the center of the pixel. The drain electrode is generally made of a metal, and as such, may cause the aperture ratio to be lowered. In this exemplary embodiment, the overall aperture ratio of the pixel can be improved by minimizing or reducing the reduction in aperture ratio caused by the drain electrode 173'.

FIGS. 5A to 5D are views sequentially showing a fabrication process of an array substrate according to one exemplary embodiment. Referring to FIGS. 5A to 5D, a method of fabricating an array substrate according to one exemplary embodiment will now be described.

Figure 5A:
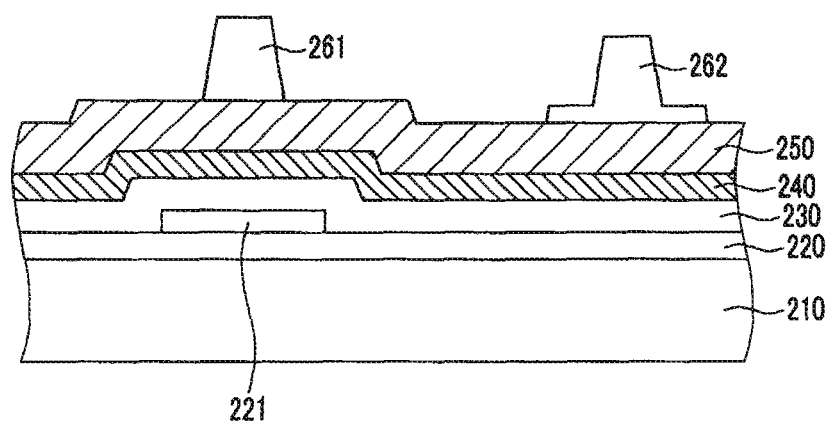
FIGS. 5A to 5D are views sequentially showing a fabrication process of an array substrate according to one exemplary embodiment.

Referring to FIG. 5A, a polysilicon layer 220 is laminated on an insulation substrate 210, and then an active layer 221 is formed by a first mask process. Thereafter, a gate insulating film 230, a transparent conductive film 240, and an opaque conductive film 250 are sequentially laminated, a photoresist layer is formed, and then a first photoresist film 261 and a second photoresist film 262 are formed from the photoresist layer by a second mask process. In the second mask process for forming the photoresist films 261 and 262, the second photoresist film 262 is formed to have a wider bottom than top by using a half-tone mask. In this exemplary embodiment, the transparent conductive film 240 and the opaque conductive film 250 include ITO and molybdenum, respectively. However, these materials are only illustrative, and the materials of the transparent conductive film 240 and opaque conductive film 250 are not limited thereto.

Figure 5B:
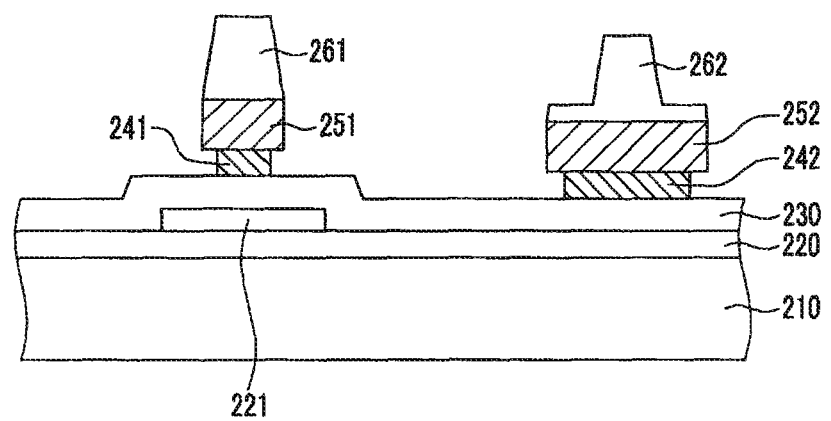

Referring to FIG. 5B, a first etching process is performed on the opaque conductive film 250, and thereafter a second etching process is performed on the transparent conductive film 240. Here, the first etching process is a dry etching process using, for example, a gas plasma reaction, whereby an opaque conductive film 251 and an opaque lower electrode 252 respectively having substantially the same widths as the first photoresist film 261 and the second photoresist film 262 are formed under the first photoresist film 261 and the second photoresist film 262. The second etching process may be a wet etching process using, for example, an etchant that is able to etch a particular material, whereby a transparent conductive film 241 and a transparent lower electrode 242 respectively having smaller widths than those of the opaque conductive film 251 and the opaque lower electrode 252 are formed under the opaque conductive film 251 and the opaque lower electrode 252. In the second etching process, cross-sectional etching may also be performed. In the second etching process, fine etching of about 0.2 μm may be performed in a cross-sectional direction.

Alternatively, the first etching process may be carried out as a wet etching process. In the case where the first etching process is performed as a wet etching process, the opaque conductive film 251 and the opaque lower electrode 252 are configured to be finely etched in the cross-sectional direction under the first photoresist film 261 and the second photoresist film 262.

Figure 5C:
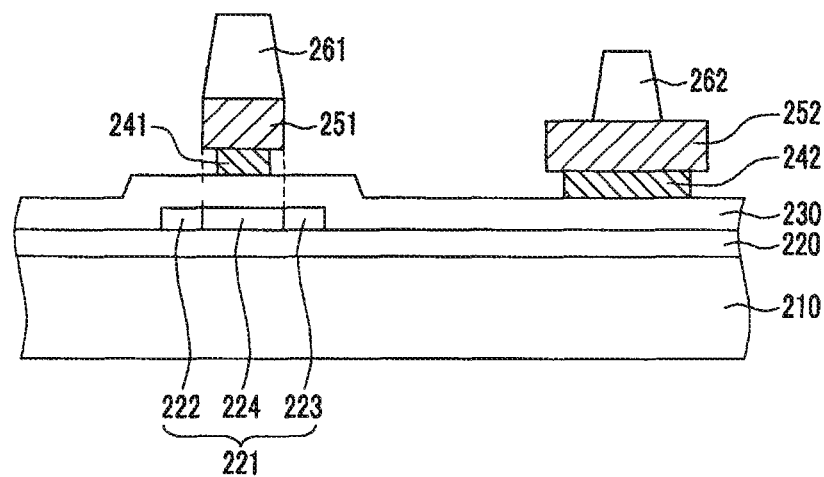

Referring to FIG. 5C, a source region 222 and a drain region 223 are formed by doping the active layer 221 with a P+ impurity such as boron on the top of the insulation substrate 210. Thereafter, the bottom of the second photoresist film 262 is removed by an ashing process to expose the opaque lower electrode 252 under the second photoresist film 262.

Figure 5D:
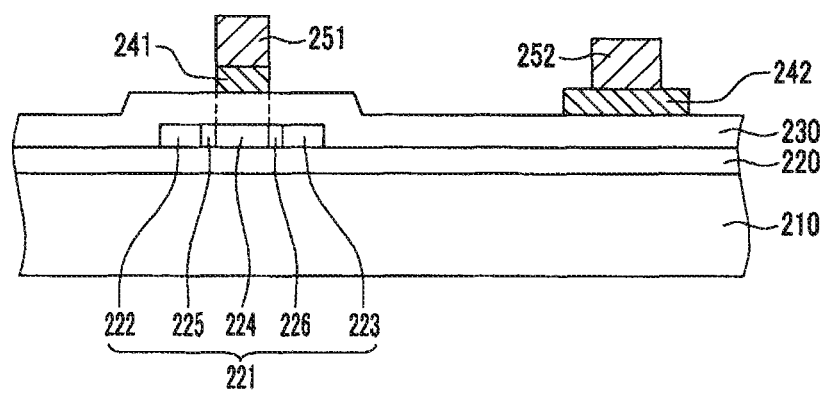

Referring to FIG. 5D, a third etching process is performed on the material of the opaque conductive film in order to reduce the width of the opaque lower electrode 252. The third etching process may be carried out as a wet etching process, whereby the opaque conductive film 251 and the opaque lower electrode 252 may be etched to have smaller widths than the widths of the first photoresist film 261 and the second photoresist film 262, respectively. As a result of this, as shown in FIG. 5D, the opaque conductive film 251 can have approximately the same width as the opaque conductive film 241, and the opaque lower electrode 252 can have a smaller width than the width of the transparent lower electrode 242, thereby improving the aperture ratio of the pixel.

Subsequent to the third etching process, a P− impurity is lightly doped on the top of the insulation substrate 210 to form a lightly doped drain region (225 and 226), and accordingly a channel region 224 is formed at the center of the active layer 221.

As such, after forming a gate electrode of a thin film transistor including the opaque conductive film 251 and transparent conductive film 241, the active layer 221 of the thin film transistor, and a lower electrode of a storage capacitor including the opaque lower electrode 252 and the transparent lower electrode 242, the remaining components may be formed according to a general process. That is, the thin film transistor and the storage capacitor are formed by sequentially forming a first interlayer insulating layer, an upper electrode of the storage capacitor, a second interlayer insulating layer, first to third contact holes, and a source electrode and drain electrode, and a protective film and an organic film are laminated so as to cover the thin film transistor and the storage capacitor. A via hole is formed in the protective film and the organic film, and then a pixel electrode is formed on the top thereof, thereby completing an array substrate. As described above, the protective film may be omitted in order to improve the aperture ratio.

By the process described hereinabove, a gate line and the gate electrode can be formed to have a double layer including the opaque conductive film 251 and the transparent conductive film 241, and the lower electrode of the storage capacitor can also be formed to have a double layer including the opaque lower electrode 252 and the transparent lower electrode 242. Therefore, signal delay can be suppressed or reduced, the aperture ratio can be improved, and the picture quality can be enhanced by reducing leakage current. Moreover, according to the above process, no additional mask is required to form the opaque conductive film 251, the transparent conductive film 241, the opaque lower electrode 252, and the transparent lower electrode 242. Thus, no mask process is added, thus simplifying the process.

While this disclosure has been described in connection with what is presently considered to be practical exemplary embodiments, it is to be understood that the invention is not limited to the disclosed embodiments. The scope of the present invention is determined by the claims that follow. Those skilled in the art will recognize that various modifications and changes can be made without departing from the spirit and scope of the claims.

What is claimed is:

1. An array substrate comprising:
    an active layer comprising a channel region;
    a gate electrode positioned corresponding to the channel region; and
    a gate insulating film between the active layer and the gate electrode,
    wherein the gate electrode comprises a transparent conductive film and an opaque conductive film, and the transparent conductive film is between the channel region and the opaque conductive film; and
    a capacitor comprising:
        a transparent lower electrode;
        an opaque lower electrode directly contacting the transparent lower electrode;
        a first insulating film on the transparent lower electrode and utilized as a dielectric film; and
        an upper electrode on the first insulating film.

2. The array substrate of claim 1, wherein the transparent conductive film and the opaque conductive film are in direct contact with each other.

3. The array substrate of claim 1, wherein the transparent conductive film comprises indium tin oxide (ITO), and the opaque conductive film comprises molybdenum.

4. The array substrate of claim 1, wherein the active layer comprises polysilicon, the active layer further comprising a source region on one side of the channel region and a drain region on an opposite side of the channel region, wherein the channel region comprises N-type impurities, and the source region and the drain region comprise P-type impurities.

5. The array substrate of claim 1,
    wherein the upper electrode is positioned on the first insulating film corresponding to the transparent lower electrode.

6. The array substrate of claim 1, wherein the transparent lower electrode and the opaque lower electrode are comprised of the same materials as the transparent conductive film and the opaque conductive film, respectively.

7. The array substrate of claim 1, wherein the transparent lower electrode and the opaque lower electrode are arranged on the same layer as the transparent conductive film and the opaque conductive film, respectively.

8. The array substrate of claim 1, wherein the upper electrode comprises a transparent conductive material.

9. The array substrate of claim 1, wherein a width of the transparent lower electrode is greater than a width of the upper electrode.

10. The array substrate of claim 1, further comprising a second insulating layer on the first insulating film,
    wherein the first insulating film is on the gate electrode, the active layer, and the gate insulating film, and
    the upper electrode is between the first insulating film and the second insulating layer.

11. The array substrate of claim 10, further comprising:
    a source electrode connected to the source region through a first hole in the first insulating film and the second insulating layer; and
    a drain electrode connected to the drain region through a second hole in the first insulating film and the second insulating layer, and connected to the upper electrode through a third hole in the second insulating layer.

12. The array substrate of claim 11, wherein the third hole is positioned corresponding to the opaque lower electrode, with the first insulating film and the upper electrode interposed therebetween.

13. The array substrate of claim 11, further comprising an organic film on the second insulating layer, the source electrode, and the drain electrode.

14. The array substrate of claim 13, further comprising a protective film separating the second insulating layer and source and drain electrodes from the organic film.

15. The array substrate of claim 13, further comprising a pixel electrode connected to the drain electrode through a fourth hole in the organic film.

16. The array substrate of claim 15, wherein the fourth hole is positioned corresponding to the opaque lower electrode, with the first insulating film, the upper electrode, and the drain electrode interposed therebetween.

17. The array substrate of claim 1, wherein the transparent conductive film and the opaque conductive film have substantially a same width.

\* \* \* \* \*